United States Patent [19]

Shimizu

[11] 4,223,268
[45] Sep. 16, 1980

[54] FREQUENCY DIVIDING CIRCUIT OF VARIABLE FREQUENCY DIVIDING RATIO TYPE

[75] Inventor: Akio Shimizu, Tone, Japan

[73] Assignee: Niles Parts Co., Ltd., Japan

[21] Appl. No.: 890,947

[22] Filed: Mar. 28, 1978

[30] Foreign Application Priority Data

Apr. 18, 1977 [JP] Japan .................. 52-48822

[51] Int. Cl.$^2$ ..................... H03K 21/36; H03K 21/06
[52] U.S. Cl. ........................................ 328/48; 328/51; 328/152; 307/224 R; 368/201
[58] Field of Search .................. 328/48, 51, 152, 153, 328/154; 307/224; 58/85.5

[56] References Cited

U.S. PATENT DOCUMENTS

| | | | |
|---|---|---|---|
| 3,202,837 | 8/1965 | Baracket | 328/51 X |
| 3,263,174 | 7/1966 | Bjorkman et al. | 328/48 X |
| 3,456,200 | 7/1969 | Bos | 307/224 X |
| 4,068,462 | 1/1978 | Duff et al. | 328/48 X |
| 4,084,082 | 4/1978 | Alfke | 328/48 X |

Primary Examiner—John S. Heyman
Attorney, Agent, or Firm—Lane, Aitken, Ziems, Kice & Kananen

[57] ABSTRACT

A frequency dividing circuit for dividing an input signal provided from a signal source at a selected dividing ratio includes first and second cascade-connected frequency dividers with signal controlling gates connected between the signal source and the first frequency divider, between the first and second frequency dividers, and between the signal source and the gates connected between the first and second frequency dividers. The signal controlling gates may be selectively controlled by a control switch to define a first signal path that includes both the first and second frequency dividers to effectively divide the input signal by both frequency dividers or a second signal path that includes only the second frequency divider to effectively divide the input signal by the second frequency divider only. The circuit includes input amplifiers which may be connected to various signal sources including signal sources that employ crystal oscillators, RC oscillators, and other types of oscillating circuits.

7 Claims, 3 Drawing Figures

FREQUENCY DIVIDING CIRCUIT OF VARIABLE FREQUENCY DIVIDING RATIO TYPE

BACKGROUND OF THE INVENTION

1. FIELD OF THE INVENTION

The present invention relates to a variable frequency dividing circuit adapted to receive a signal from various types of signal sources operating in different frequency zones or ranges and provide a frequency divided output to synchronize various signal-receiving units such as a car clock, flashers, intermittently operated wipers or the like in which circuit the frequency dividing ratio is electrically controlled.

2. DESCRIPTION OF THE PRIOR ART

In conventional frequency divider circuits, it has been a common practice to connect a frequency dividing circuit to a specific oscillating source and obtain various timing signals from the various stages of the frequency dividing circuit to synchronize various types of operating units such as a car clock, flasher, intermittently operated wipers and so forth with the aforesaid timing signals.

In these conventional frequency dividing circuits, the frequency dividing ratio has been kept fixed, and because timing pulses for the operating units are also specifically designated, the result is that the frequency of the oscillating source must also be specified. Consequently, the aforementioned frequency dividing circuit is not readily adapted to oscillating sources of similar or different type operating in different frequency or ranges. Also, since most frequency divider circuits are fabricated as integrated circuits having a limited number of output pins it is difficult to alter the frequency dividing ratio by changing the connections of the output pins. As a result, it has been necessary to specifically design the frequency dividing circuits for corresponding oscillating sources and with the resultant disadvantage that production efficiency and maintenance efficiency are reduced because full standardization cannot be achieved.

SUMMARY OF THE INVENTION

In view of this, it is a principal object of the present invention to eliminate the abovementioned shortcomings and provide a unique frequency dividing circuit of variable frequency dividing ratio type arranged to obtain a specifically desired timing pulse by electrically changing the frequency dividing ratio so the circuit is compatible with various kinds of oscillating sources operating in different frequency zones or ranges.

It is another object of the present invention to provide a frequency dividing circuit of variable frequency dividing ratio type to provide correctly timed output signals to the various operating units of a car, for example, such as a car clock, flasher, intermittently working wiper and the like.

It is a further object of the present invention to provide a frequency dividing circuit of variable frequency dividing ratio type that includes, as part of an integrated circuit, an amplifier and/or buffer amplifier comprising a part of oscillating circuit, frequency dividing circuits and controllable gates for controlling the frequency dividing circuits.

It is a still further object of the present invention to provide a frequency dividing circuit of variable frequency dividing ratio type characterized in that a feedback circuit is provided that includes a crystal oscillating element, a resistor and a capacitor.

DESCRIPTION OF THE PREFERRED EMBODIMENTS

Figure 1:
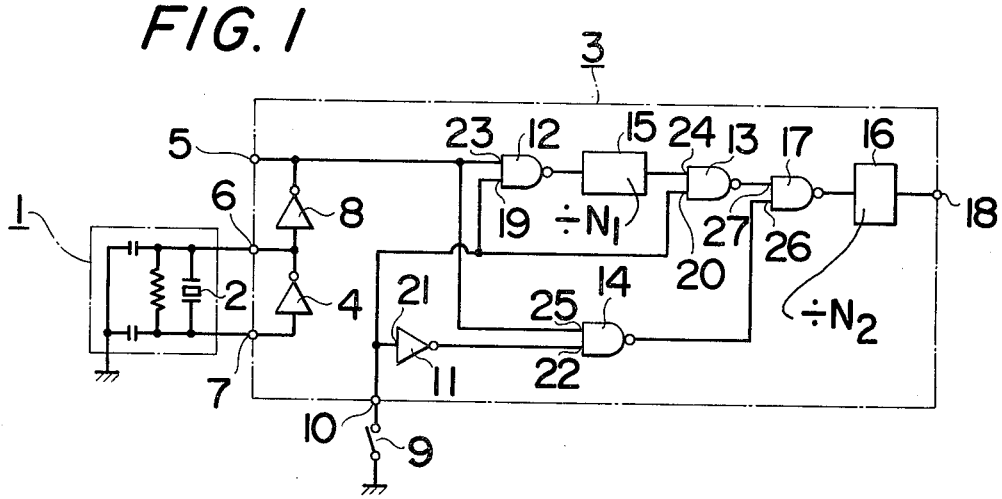
FIG. 1 illustrates a frequency dividing circuit embodiment wherein a crystal oscillator is used as an oscillating source.
Figure 2:
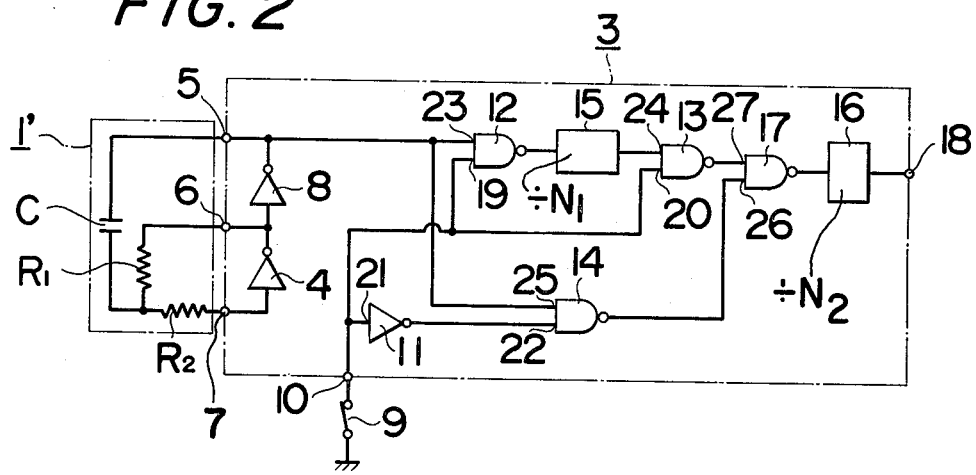
FIG. 2 illustrates the circuit embodiment of FIG. 1 wherein a RC oscillator is used as an oscillating source.
Figure 3:
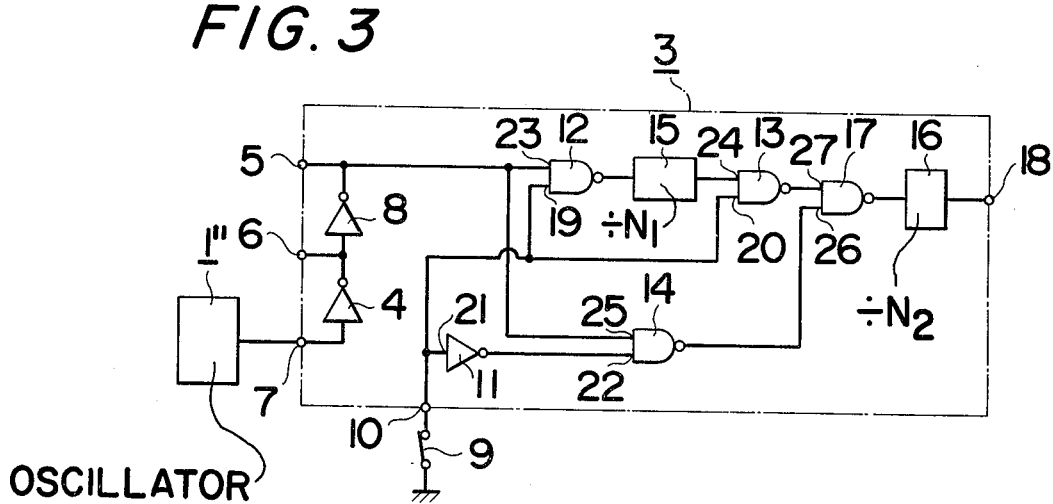
FIG. 3 illustrates the circuit embodiment of FIGS. 1 and 2 wherein an oscillating source is connected to the external pins of an integrated circuit.

FIGS. 1-3 illustrate a variable frequency divider circuit 3 in accordance with the present invention connected to a different type of frequency-source circuit 1, 1', and 1''. The dividing circuit 3 is preferably fabricated as an integrated circuit (shown enclosed by the dot-dash line in FIGS. 1-3) that includes externally accessible pins 5, 6, and 7 for connection to the external oscillator circuits, 1, 1', and 1'', a pin 18 from which the circuit output is obtained, and a pin 10 for connection to a control switch 9, which, depending upon its position, selects the frequency division ratio of the circuit 3 as described more fully below.

As shown in FIGS. 1-3, the variable frequency divider circuit 3 includes an amplifier 4 having its input connected to the pin 7, a buffer amplifier 8 having its input connected to both the pin 6 and the output of the amplifier 4 and its output connected to the pin 5 and an input 23 of a signal controlling NAND gate 12. A frequency divider 15, having a frequency division ratio $N_1$, has its input connected to the output of the signal controlling NAND gate 12 and its output connected to an input 24 of a signal controlling NAND gate 13. The output of the NAND gate 13 is connected to an input 27 of a signal controlling NAND gate 17, the output of which is connected to the input of a second frequency divider 16, having a frequency division ratio $N_2$. The inputs 19 and 20 of the NAND gates 12 and 13, which inputs constitute control inputs, are connected to the pin 10, which in turn, is connected to the control switch 9 operable between an open position, as shown in FIG. 1, and a closed position as shown in FIGS. 2 and 3. An input 26 of the NAND gate 17, which constitutes the control input for the gate 17, is connected to the output of a NAND gate 14 which has one of its inputs 25 connected to the pin 5, the output of the buffer amplifier 8, and the input 23 of the NAND gate 12, and the other of its inputs 22 connected to the output of an inverter 11. An input 21 of the inverter 11 is connected to the pin 10 and to the control switch 9.

The various NAND gates are adapted to be enabled or inhibited in response to the position of the control switch 9 to control the division rate of the circuit 3. As is known in the logic art, the designation of the logic control states is arbitrary and, as defined herein, the pin 10 becomes logic zero when the control switch 9 is closed, and, conversely, becomes logic one when the control switch 9 is open.

In FIG. 1, the frequency dividing circuit 3 is connected to the oscillating signal source 1 that includes a crystal oscillating element 2 and associated resistors and capacitors in which the signal source 1 is connected to the circuit 3 through the pins 6 and 7 such that the amplifier 4 assists in providing circuit feedback.

When the control switch 9 is opened, as shown in FIG. 1, to make pin 10 logic one, the input terminals 19 and 20 of the NAND gates 12 and 13 become logic one and the input terminal 21 of the inverter 11 also becomes logic one with the input terminal 22 of the NAND gate 14 becoming logic zero.

As a result, the outputs of the NAND gates 12 and 13 are controlled by the signals applied to their input signal terminals 23 and 24, respectively, while the output of the NAND gate 14 becomes logic one irrespective of the signal applied to its signal input terminal 25.

Consequently, the control input terminal 26 of the NAND gate 17 becomes logic one with the output of this NAND gate controlled by the signal applied to its signal input terminal 27 from the output of the NAND gate 13. Thus, as can be appreciated by those skilled in the art, when the control switch 9 is operated to make pin 10 logic one, the gates 12, 13, and 17 are enabled while the gate 14 is inhibited. When the circuit 3 is connected to a crystal oscillating source 1 as shown in FIG. 1 through pins 6 and 7, the output sine wave of the crystal oscillator, that is, the output of the amplifier 4 is applied through the buffer amplifier 8 to the signal input terminal 23 of the NAND gate 12. As the square wave of the output of the amplifier 4 passes through the gate 12, it is complemented to a square wave of auxiliary or complementary phase and inputted to the frequency dividing circuit 14 which divides its input signal by its dividing ratio $N_1$. The output of the frequency dividing circuit 15 is passed to and through the NAND gate 17 and to and through the NAND gate 13 with each gate, 13 and 17, providing an output that is the complement of its input. The output of the NAND gate 17 is inputted to the frequency dividing circuit 16 which divides its input signal by its dividing ratio $N_2$. Therefore, at the timing pulse output pin 18, which is the output terminal of the frequency dividing circuit, a timing pulse of frequency dividing ratio $N_1 \times N_2$ is obtained.

FIG. 2 illustrates an RC oscillator 1' as an oscillating source connected to the frequency dividing circuit 3. As shown in FIG. 2, the RC feedback circuit 1' comprises resistors $R_1$ and $R_2$ and a capacitor C connected to the external circuit pins 5, 6 and 7 of the integrated circuit 3 to provide an RC oscillator together with the amplifier 4 and the buffer amplifier 8. The internal circuitry of the integrated circuit 3 is the same as in FIG. 1.

Since the control switch 9 is CLOSED, as shown in FIG. 2, the input terminals 19 and 20 of the NAND gates 12 and 13 become logic zero while the input terminal 21 of the inverter 11 becomes logic zero, the input terminal 22 of the NAND gate 14 to become logic one.

As a result, the outputs of the NAND gates 12 and 13 are held at logic are independent of the signals applied to their input terminals 23 and 24 and the output of the NAND gate 14 is controlled substantially by the signal applied to its signal input terminal 25. The input terminal 27 of the NAND gate 17 is held at logic 1 because of its connection to the output of the gate 13 and the output of the NAND gate 26 is controlled by the signal applied to the input terminal 26 from the NAND gate 14. In this condition, the output of RC oscillator is passed to the frequency dividing circuit 16 via the NAND gates 14 and 17. Since the output of the NAND gate 12 is held at logic one, the frequency dividing circuit 15 is inoperative. Therefore, at the timing pulse output pin 18, a timing pulse of frequency dividing ratio $N_2$ is obtained.

FIG. 3 shows a crystal clock 1" as an oscillating source connected to the integrated circuit 3. As indicated therein, 1" is an oscillating source connected to the external circuit connecting pin 7 with the amplifier 4 and the buffer amplifier 8 used substantially as a buffer amplifier. The construction of other portions is the same as in FIG. 2. In configuration shown in FIG. 3, in which the control switch 9 is closed to cause the output of the oscillating source 1" to be passed to the frequency dividing circuit 16 through the amplifier 4, buffer amplifier 8, the NAND gate 14 and the NAND gate 17. Therefore, at the timing pulse output pin 18, a timing pulse of frequency dividing ratio $N_2$ is obtained.

It is a simple matter to provide similarly constructed circuits including n frequency dividing circuits to embody the frequency dividing ratio $N_n \cdot N_{n-1} \cdot N_{n-2} \ldots N_1$, $N_{n-2} \cdot N_{n-3} \cdot N_{n-4} \ldots N_1$, $N_{n-3} \cdot N_{n-4} \cdot N_{n-5} \ldots N_1$.

In accordance with the present invention, as described above, specific timing pulses can be assured by changing the frequency dividing ratio through the operation of the control switch 9 even where oscillating sources operating in different frequency zones such as a crystal oscillator, RC oscillator and/or a desired oscillator connected as the external circuit of the integrated circuit 3, hence the present invention can save the necessity of specially preparing the frequency dividing circuits corresponding to individual oscillating sources.

Furthermore, as the integrated circuit 3 contains the amplifier 4, the buffer amplifier 8 and the external circuit connecting pins 5, 6 and 7 acting as the input and output terminals of the amplifiers, various types of oscillating sources can be embodied depending on the nature of feedback circuits for these various types of oscillating sources.

What is claimed is:

1. A variable frequency divider circuit for dividing an input signal having a selected frequency, comprising:

a first signal-dividing path that includes, in series connection, a first signal-controlling gate having a signal input adapted for connection to an input signal source, a first frequency divider having its signal input connected to a signal output of said first gate for dividing a signal at a selected ratio, a second signal-controlling gate having a signal input connected to the output of said first frequency divider circuit, a third signal-controlling gate having a first input connected to a signal output of said second gate, and a second frequency divider having its input connected to a signal output of said third gate for dividing a signal at a selected ratio;

a second signal-dividing path that includes, in series connection, a fourth signal-controlling gate having its signal input adapted for connection to the input signal source, a second input of said third gate connected to the output of said fourth gate, and said second frequency divider having its input connected to the signal output of said third gate; and control switch means coupled to control inputs of said first, second, and fourth gates and operable between first and second states, said control switch means, when in said first state, effective to inhibit said fourth gate and enable said first, second, and third gates wherein the input signal is applied through said first signal-dividing path and, when in said second state, effective to inhibit said first and second gates and enable said third and fourth gates wherein the input signal is applied through said second signal-dividing path.

2. A variable frequency dividing circuit for dividing an input signal, comprising:

first and second frequency dividers each having an input and an output and first, second, third, and fourth control gates each having, respectively, a signal input, a control input, and an outut, said control gates selectively enabled and inhibited in response to control signals provided to their control inputs, the signal input of said first gate adapted for connection to a signal source that provides an input signal at a selected frequency;

said first gate having its control input coupled to a control switch means operable between a first position and a second position and its output coupled to the input of said first frequency divider;

said second gate having its control input coupled to said control switch means, its signal input coupled to the output of said first frequency divider, and its output coupled to the signal input of said third gate;

said third gate having its control input coupled to the output of said fourth gate and its signal output coupled to the input of said second frequency divider;

said fourth gate having its signal input coupled to said signal input of said first gate, and its control input coupled to said control switch means;

said control switch means, when in its first position, providing a control signal to the control inputs of said first, second, third, and fourth gates to enable said first, second, and third gates and inhibit said fourth gate such that the input signal passes through said first gate, said first frequency divider, said second and third gates, and said second frequency divider with the division of the input signal responsive to the division ratios of said first and said second frequency divider circuit; and said control switch means, when in its second position, providing a control signal to said control inputs of said first, second, and third and fourth control gates to enable said third and fourth control gates and inhibit said first and second gates such that the input signal passes through said fourth and said third gates, and said second frequency divider circuit with the division of the input signal responsive to said second frequency divider circuit only.

3. The variable frequency divider circuit claimed in claims 1 or 2 further comprising:

a first amplifier having its output coupled to said signal input of said first control gate and its input adapted for coupling to the input signal source, said amplifier output also adapted for coupling to said signal source to provide a feedback path therefor.

4. The variable frequency divider circuit claimed in claim 3 further comprising:

a second amplifier serially connected intermediate said first amplifier and said control gate to buffer the output of said first amplifier.

5. The variable frequency divider circuit claimed in claim 4 wherein said circuit is fabricated as a unitary integrated circuit and includes a first externally accessible pin connected to the input of said first amplifier, a second externally accessible pin connected between said first and second amplifiers, and a third externally accessible pin connected to the output of said second amplifier.

6. The variable frequency divider circuit claimed in claim 4 wherein said signal controlling gates are NAND gates.

7. The variable frequency divider circuit claimed in claim 4 wherein the input signal source is an automobile clock oscillator circuit.

* * * * *